United States Patent
Jin et al.

(10) Patent No.: US 8,742,871 B2
(45) Date of Patent: Jun. 3, 2014

(54) DEVICES AND BANDPASS FILTERS THEREIN HAVING AT LEAST THREE TRANSMISSION ZEROES

(75) Inventors: Jun-De Jin, Hsinchu (TW); Ming Hsien Tsai, Sindian (TW); Tzu-Jin Yeh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 185 days.

(21) Appl. No.: 13/044,619

(22) Filed: Mar. 10, 2011

(65) Prior Publication Data
US 2012/0229318 A1    Sep. 13, 2012

(51) Int. Cl.
*H03H 7/01* (2006.01)
*H03H 7/00* (2006.01)

(52) U.S. Cl.
USPC ............... 333/175; 333/185; 333/177

(58) Field of Classification Search
USPC ............ 327/557; 333/185, 175, 204, 177
See application file for complete search history.

(56) References Cited

U.S. PATENT DOCUMENTS

| | | | | |
|---|---|---|---|---|
| 5,697,087 A * | 12/1997 | Miya et al. | ................ | 455/307 |
| 5,867,076 A * | 2/1999 | Tada et al. | .................. | 333/206 |
| 5,917,387 A * | 6/1999 | Rice et al. | .................. | 333/174 |
| 6,184,760 B1 * | 2/2001 | Wada et al. | ................. | 333/204 |
| 6,549,093 B2 * | 4/2003 | Tsukamoto et al. | ......... | 333/134 |
| 7,262,674 B2 * | 8/2007 | Kamgaing | .................. | 333/168 |
| 7,276,995 B2 * | 10/2007 | Hamada et al. | ............. | 333/204 |
| 7,346,134 B2 * | 3/2008 | Smith | ....................... | 375/346 |
| 7,439,840 B2 | 10/2008 | Carastro et al. | | |
| 7,669,312 B2 | 3/2010 | Terrovitis | | |
| 7,795,995 B2 * | 9/2010 | White et al. | .................. | 333/134 |
| 7,924,114 B2 * | 4/2011 | Tsuzuki et al. | .............. | 333/99 S |
| 2002/0014931 A1 * | 2/2002 | Tsukamoto et al. | .......... | 333/134 |
| 2003/0184403 A1 | 10/2003 | Goyette et al. | | |
| 2005/0148312 A1 * | 7/2005 | Toncich et al. | ............... | 455/339 |
| 2005/0237131 A1 * | 10/2005 | Chang et al. | .................. | 333/175 |
| 2007/0085108 A1 * | 4/2007 | White et al. | .................. | 257/173 |
| 2007/0296525 A1 * | 12/2007 | Kokubo | ........................ | 333/175 |
| 2009/0153270 A1 * | 6/2009 | Beerwerth | .................... | 333/202 |
| 2009/0267704 A1 * | 10/2009 | Chang et al. | .................. | 333/175 |
| 2010/0214037 A1 * | 8/2010 | Plager et al. | .................. | 333/185 |
| 2011/0006861 A1 * | 1/2011 | White et al. | .................. | 333/204 |

OTHER PUBLICATIONS

Tang, C.W., et al., "Development of Multilayered Bandpass Filters With Multiple Trabsmission Zeros Using Open-Stub/Short-Stub/Serial Semilumped Resonators", IEEE Transactions on Microwave Theory and Techniques, Mar. 2010, 58(3):624-634.

Hong, J.S. et al., "Basic Concepts and Theories of Filters", Chapter 3—Microstrip Filters for RF/Microwave Applications, 2001, John Wiley and Sons, pp. 29-76.

* cited by examiner

*Primary Examiner* — Temesgh Ghebretinsae
*Assistant Examiner* — Devan Sandiford
(74) *Attorney, Agent, or Firm* — Duane Morris LLP

(57) ABSTRACT

A bandpass filter comprises a first capacitor, a second capacitor, a third capacitor and at least two resonators. The first and second capacitors are coupled in parallel with each other, and each of the first and second capacitors includes an input. The third capacitor is coupled between the first capacitor and the second capacitor at their respective inputs. The at least two resonators are coupled in parallel with the first capacitor and the second capacitor and are positioned adjacent to each other at a distance such that the at least one component of the resonators are electromagnetically coupled together to provide three (3) transmission zeros.

7 Claims, 4 Drawing Sheets

DEVICES AND BANDPASS FILTERS THEREIN HAVING AT LEAST THREE TRANSMISSION ZEROES

BACKGROUND

A filter is a circuit device that passes frequencies within a certain range (a pass band) and rejects (attenuates) frequencies outside that range (a stop band). The attenuation as a function of frequency is known as the filter transmission function. Bandpass filters can contain resonant circuits that in some configurations determine the frequencies at which the characteristics of the filter transmission function occur. The transmission function may be characterized by a distinct drop in the amplitude transmitted above or below a particular frequency (known as a cutoff). The characteristics may include one or more frequencies at which a high proportion of signal power is transmitted (a peak) or where a particularly low proportion of signal power is transmitted (a zero or null). Although low points are conventionally termed zeroes or nulls, the transmission power is typically not zero at such frequencies, which are merely the frequencies at which the attenuation is greatest.

In one example, such as a Chebyshev low pass filter comprising passive circuit elements, a basic form might have one LC resonant element (with just one inductor) that determines a cutoff frequency above which signal power is attenuated. Another example is a bandpass filter with two LC resonators that generate spaced transmission zeros. A bandpass or bandstop filter topology can be provided, for example, by providing highpass and/or lowpass stages in a sequence, the stages having different cutoff frequencies, because the filter characteristics of successive stages are superimposed on one another (i.e., multiplied).

A two resonator bandpass filter may have poor stop band attenuation at low-frequencies. Such performance might be improved by adding additional filter stages, to further attenuate the stop band or perhaps to improve the sharpness of the cutoff between the pass band and the stop band. If additional transmission zeros and other characteristics and stages with resonant elements are desired, more inductors are needed, consuming additional physical area. In these examples and in other ways, multiple resonant elements, each having at least one inductor and capacitor, contribute to filter transmission functions but consume circuit space.

The resonant elements, sometimes termed LC resonators or tanks, can comprise inductors and capacitors arranged in series and/or parallel according to different configurations. The resonant elements are combined, for example, in a ladder circuit. It is possible to employ a number of functionally combined elements with distinct resonant frequencies. Each may typically affect aspects such as the nature of a characteristic in the filter transmission function (e.g., a peak, null or cutoff) and the break frequency at which the characteristic occurs. Each resonant element has at least one inductor. If filter elements are arranged successively in cascade, for example, the transmission functions of the respective elements multiply in determining the transmission function of the cascaded elements.

In integrated circuits, an inductor can be embodied as a conductor arranged a spatial pattern on a substrate, such as the spiral pattern of a so-called Balun coil. However such inductors consume a considerable physical area on the circuit, and space is at a premium. It would be desirable to provide for a bandpass/bandstop function determined by multiple resonant elements that are cooperatively arranged, wherein the resonant elements individually or in cascade or other combination can produce highpass, lowpass, bandpass, periodic (e.g., comb filter) and/or other similar characteristics, but wherein the space required is reduced, compared to the space that would have been needed if a inductor was provided for each resonantly determined characteristic. It is desirable to provide for more complicated configurations with plural resonances and nulls or zeroes, in order to achieve good stop band attenuation, sharp cutoffs and the like, using less integrated circuit space.

Desirable in the art is an improved bandpass filter design that would improve upon the conventional bandpass filter designs by allowing for a large number of frequency breaks using minimized circuit area.

BRIEF DESCRIPTION OF THE DRAWINGS

The accompanying drawings illustrate certain examples as potential embodiments of the invention, as well as other information pertinent to the disclosure, in which.

DETAILED DESCRIPTION

Exemplary systems are discussed with reference to the figures. Although these systems are described in detail, they are provided for purposes of illustration only and various modifications are feasible.

Figure 1:
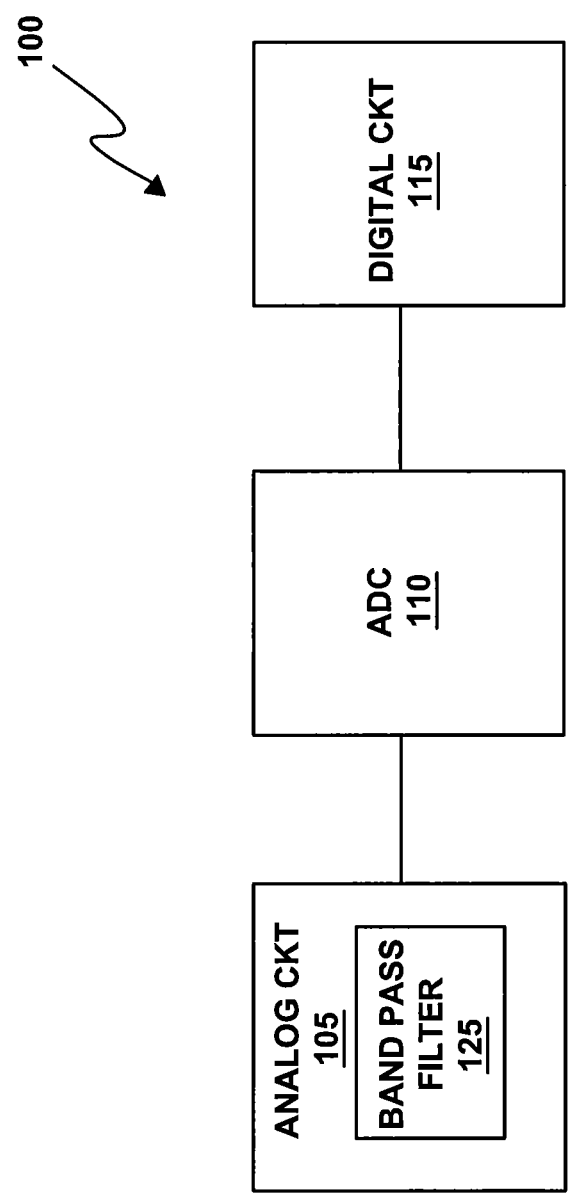
FIG. 1 is a high-level block diagram that illustrates an embodiment of an electronic device, having a bandpass filter.

FIG. 1 is a high-level block diagram that illustrates an embodiment of an electronic device 100, having a bandpass filter 125. The electronic device 100 can be a transmitter, receiver, and transceiver, among other devices. The electronic device 100 includes analog circuitry 105 that can receive analog signals and filter the received analog signals via a filter having a transmission/attenuation characteristic as a function of frequency, such as bandpass filter 125. The filter is the subject of the present disclosure and further described in connection with FIGS. 2-4. The remaining components that are shown in FIG. 1 are described briefly below and merely for completeness of the electronic device 100.

The analog circuitry 105 processes the analog signals and sends the processed analog signals to an analog to digital converter (ADC) 110 that converts the processed analog signals to digital signals. A digital circuitry 115 receives the digital signals from the ADC 110. The digital circuitry 115 can include a computing device (not shown) that receives and processes the digital signals in order for a user to operate the electronic device 100.

Figure 2:
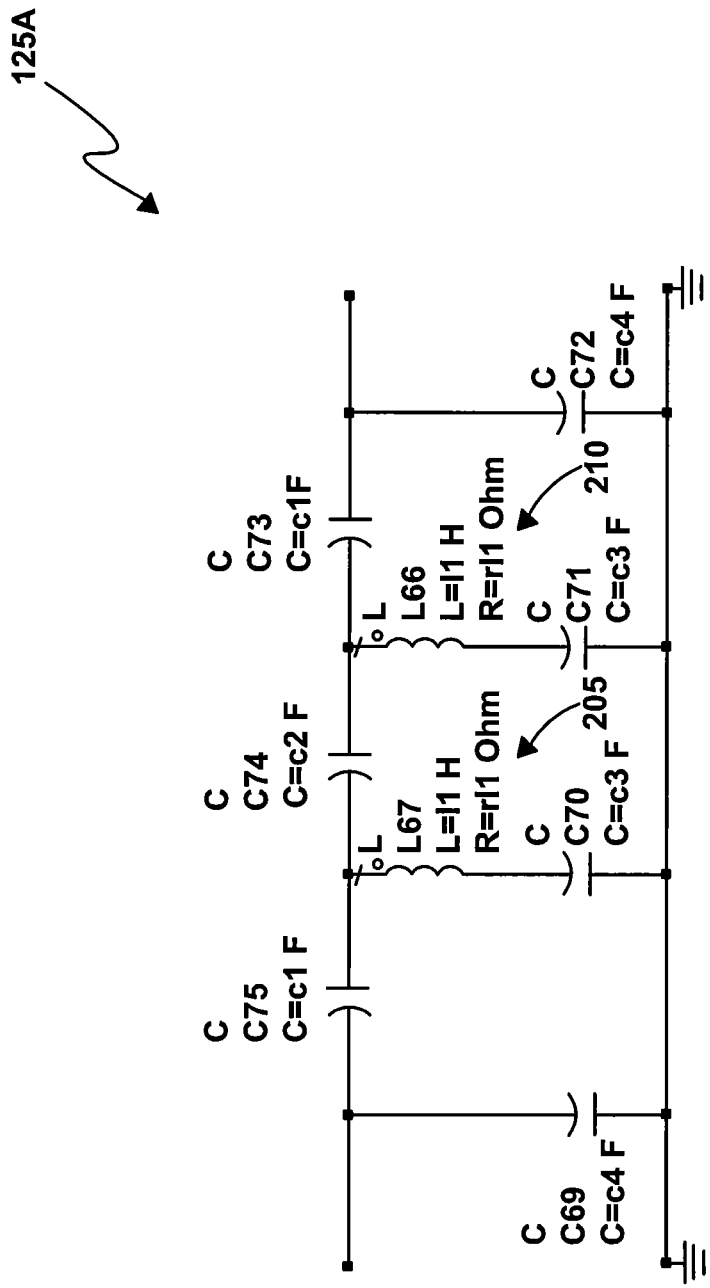
FIG. 2 is a circuit diagram that illustrates an embodiment of a bandpass filter, such as that shown in FIG. 1.

FIG. 2 is a circuit diagram that illustrates an embodiment of a bandpass filter 125A, such as that shown in FIG. 1. In this example, the bandpass filter 125A includes a first capacitor C69 and a second capacitor C72 that are coupled in parallel with each other. The first capacitor C69 and the second capacitor C72 include inputs. The bandpass filter 125A further includes a third capacitor C74 that is coupled between the first capacitor C69 and the second capacitor C72 at their respective inputs, and two resonators 205, 210 that are coupled in parallel with the first capacitor C69 and the second capacitor C72.

Each resonator 205, 210 includes an inductor L67, L66 and a capacitor C70, C71, and terminals. The third capacitor C74 is coupled between the resonators 205, 210 at their respective inputs. The bandpass filter 125 can include a fourth capacitor C75 and a fifth capacitor C73 that are coupled between the resonator 205 and the first capacitor C69, and between the resonator 210 and the second capacitor C72 at their inputs, respectively. Typically, all of the inductor (L) and capacitor (C) elements have an effect on the frequency response of the filter.

Figure 3:
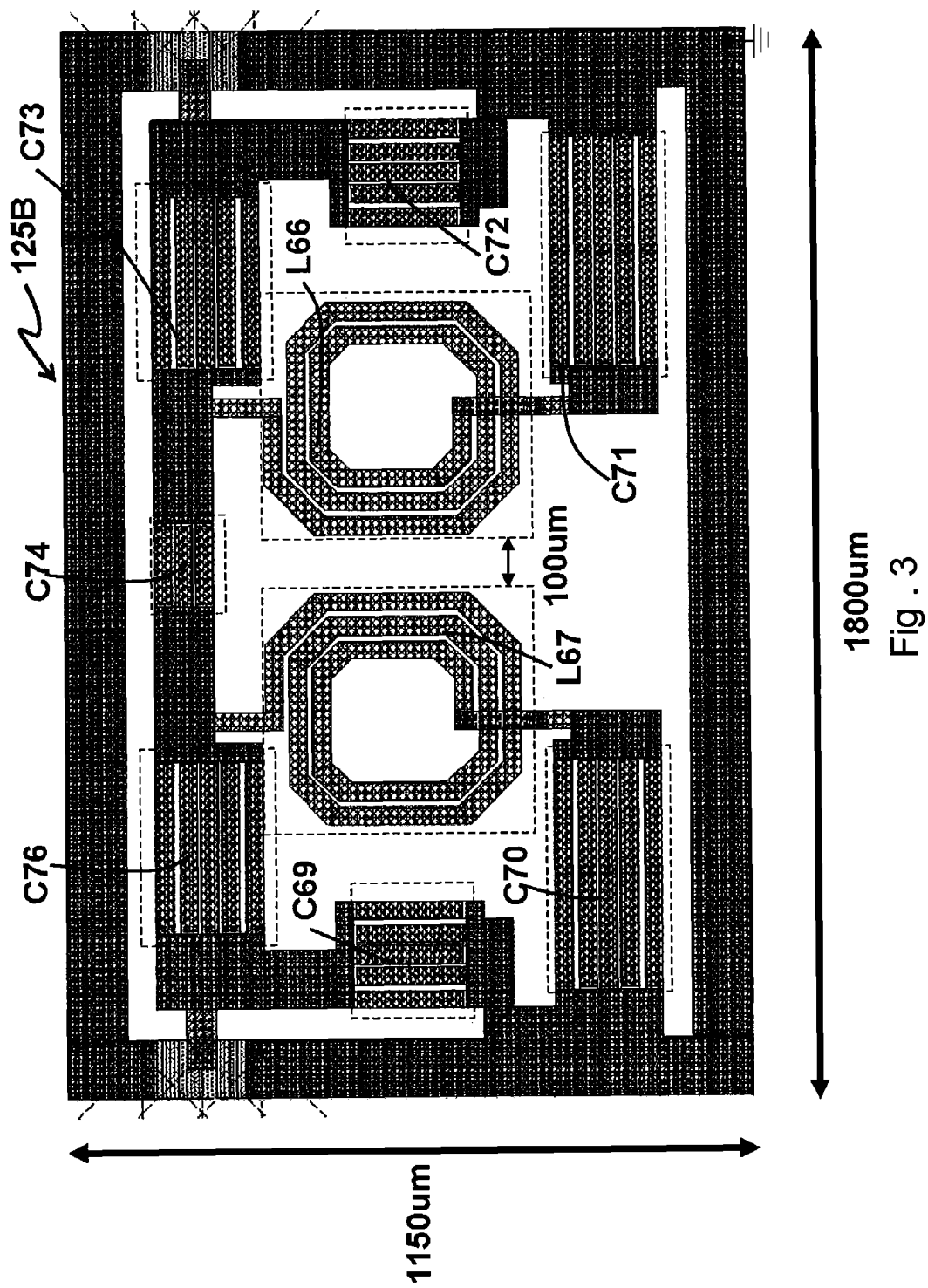
FIG. 3 is a layout diagram that illustrates a layout embodiment of a bandpass filter, such as that shown in FIG. 2.

FIG. 3 is a layout diagram that illustrates a layout embodiment of a bandpass filter 125B, such as that shown in FIG. 2. In this example, the architecture of the bandpass filter 125B of FIG. 3 is similar to the architecture of the bandpass filter 125B as described in FIG. 2. Like features are labeled with the same reference numbers, such as the first, second, third, fourth, and fifth capacitors C69, C72, C74, C75, C73, and resonators 205, 210.

Further, the inductors L67, L66 of the two resonators 205, 210 are positioned adjacent and coplanar to each other at a distance such that the inductors L67, L66 are electromagnetically coupled together. The result is to provide three (3) transmission zeros 420, 425, 430. The inductance of each coil is a function of the dimensions and number of turns of the conductor, and the inductance of the coils and their spacing influence the extent of coupling.

By placing the inductors L66, L67 close enough physically adjacent to each other, the inductors L66, L67 become a transformer. In general, a transformer is two (2) inductors magnetically coupled together, and the coupling strength is defined by the coupling coefficient (k) where k is in the range of 0~1. The example demonstrated is based on a weak k of 0.15. The dimensions of a practical embodiment as shown in FIG. 3 are such that each inductor may occupy a typical area of about 200 by 350 $\mu m^2$ to about 350 by 350 $\mu m^2$. Considering that obtaining three resonances with two LC resonant elements may eliminate an inductor and also one or two capacitors, further space saving is achieved.

Figure 4:
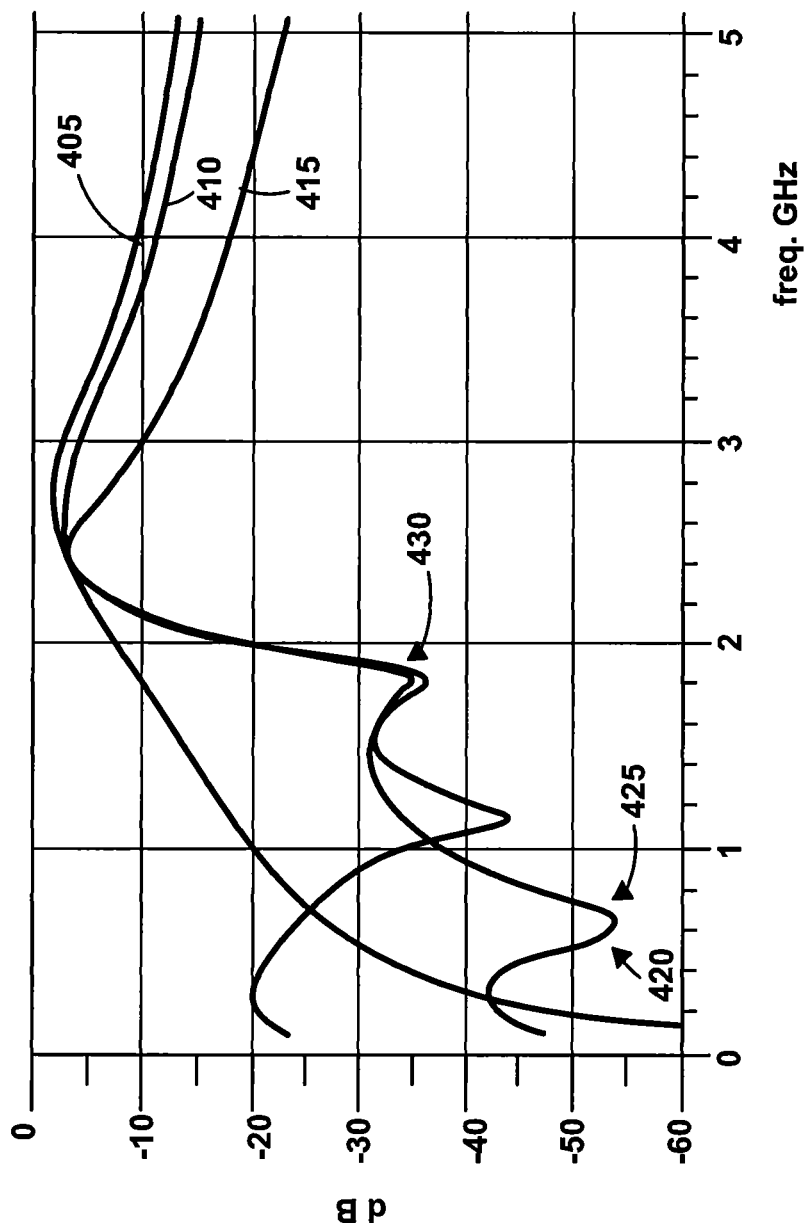
FIG. 4 is a transmission vs. frequency chart that illustrates an example of three transmission zeros as result of a bandpass filter, such as that shown in FIG. 2.

FIG. 4 is a transmission vs. frequency chart that illustrates an example of three transmission zeros 420, 425, 430 produced by a bandpass filter 125, such as that shown in FIG. 2. The bandpass filter 125 has a transmission/attenuation transfer characteristic as a function of frequency, illustrated by line graph 415, that includes these three transmission zeros 420, 425, 430 as a result of positioning the inductors L67, L66 of the two resonators 205, 210 adjacent to each other at a sufficiently small distance and/or with a sufficiently aligned orientation that inductors L67, L66 are electromagnetically coupled together. In the embodiment shown, the inductors are structured as spiral conductors placed adjacent to one another on an integrated circuit, for example on centers spaced by about 600 µm and with a space of about 100 µm between the outermost spiral turns. Thus, the magnetic flux associated with each of the respective inductors intercepts the turns of the other inductor, thus coupling the inductors electromagnetically.

In an exemplary embodiment, a first transmission zero 420 and second transmission zero 425 were generated at 600 MHz and 800 MHz, respectively, which are approximately 200 MHz apart. The first and second transmission zeros 420, 425 are generated based on the bandpass filter 125A and the values of its components. A third transmission zero 430 is generated at 1.8 GHz, which is approximately one (1) GHz apart from the second transmission zero 425. The third transmission zero is generated based on the coupling of the inductors L67, L66 of the resonators 205, 210. The particular break frequencies obtained vary with the values of the inductances and capacitances and with the degree of coupling of the inductances.

As can be seen, line graphs 405, 410 of a conventional $3^{rd}$ order Chebyshev bandpass filter (not shown) and two (2) LC resonator bandpass filters (not shown) include zero (0) transmission zeroes and two (2) transmission zeroes, respectively.

As described herein, an improved bandpass filter 125 is presented by positioning the inductors L67, L66 of at least two resonators 205, 210 adjacent to each other at a distance such that the inductors L67, L66 are electromagnetically coupled together. This approach allows for a high performance bandpass filter (BPF), having advantages including but not limited to improved stop band attenuation, and at least a third transmission zero 430 from paired resonant elements. (It is likewise possible to employ in one filter arrangement two or more such coupled inductor sets.) Some additional advantages of the disclosed bandpass filter 125, among others, include achieving the foregoing improved performance benefits without the need for new process developments, with no additional cost in manufacturing, reduced chip area compared to alternatives for improving performance involving additional resonant elements, with no or fewer peripheral circuit requirements (e.g., buffer), and no additional power consumption.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. An integrated circuit comprising:
    a bandpass filter having a first capacitor and a second capacitor coupled in parallel with each other, wherein the first capacitor and the second capacitor include inputs;
    a third capacitor coupled between the first capacitor and the second capacitor at their respective inputs;
    a first resonator coupled in parallel with the first capacitor and the second capacitor;
    a second resonator coupled in parallel with the first capacitor and the second capacitor;
    wherein each of the first and second resonators has an inductor and capacitor coupled in series with one another; and
    wherein the inductors of the first and second resonators comprise spiral conductors positioned adjacent to one another on the integrated circuit such that the inductors of the first and second resonators are magnetically coupled together, forming a transformer, and wherein the bandpass filter has a transmission/attenuation transfer characteristic having three (3) transmission zeros.

2. The integrated circuit of claim 1, wherein the spiral conductors have outer loops positioned approximately 100 micrometers apart from each other.

3. The integrated circuit of claim 1, wherein the first and the second resonators have respective inductors with spiral conductors on centers spaced by approximately 600 micrometers from each other.

4. The integrated circuit of claim 1, wherein the three transmission zeros includes a first transmission zero and second transmission zero that are approximately 200 MHz apart, and a third transmission zero that is approximately one (1) GHz apart from the second transmission zero.

5. A bandpass filter comprising:
a first capacitor and a second capacitor coupled in parallel with each other, wherein the first capacitor and the second capacitor include inputs;
a third capacitor coupled between the first capacitor and the second capacitor at their respective inputs;
a first resonator in a ladder circuit, the first resonator coupled in parallel with the first capacitor and the second capacitor;
a second resonator in a ladder circuit, the second resonator coupled in parallel with the first capacitor and the second capacitor; and
wherein the inductors of the first and second resonators comprise spiral conductors positioned adjacent to one another such that the inductors of the first and second resonators are magnetically coupled together as a transformer;
wherein the bandpass filter has three (3) transmission zeros, determined respectively by the first and second resonators and by magnetic coupling of the first and second resonators by the transformer.

6. The bandpass filter of claim 5, wherein outer loops of the spiral conductors of the inductors of the first and second resonators are positioned approximately 100 micrometers apart from each other.

7. The bandpass filter of claim 5, wherein the three transmission zeros include a first transmission zero and second transmission zero that are generated approximately 200 MHz apart, and a third transmission zero that is generated approximately one (1) GHz apart from the second transmission zero.

* * * * *